(12) United States Patent
Happ et al.

(10) Patent No.: US 7,916,524 B2
(45) Date of Patent: Mar. 29, 2011

(54) PROGRAM METHOD WITH LOCALLY OPTIMIZED WRITE PARAMETERS

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 486 days.

(21) Appl. No.: 11/768,540

(22) Filed: Jun. 26, 2007

(65) Prior Publication Data
US 2009/0003044 A1    Jan. 1, 2009

(51) Int. Cl.
G11C 11/00    (2006.01)
(52) U.S. Cl. .................... 365/163; 365/34; 365/113
(58) Field of Classification Search .............. 365/34, 365/113, 163
See application file for complete search history.

(56) References Cited

U.S. PATENT DOCUMENTS

| 2004/0151023 | A1* | 8/2004 | Khouri et al. .......... 365/163 |
| 2005/0232014 | A1* | 10/2005 | Kund et al. ............ 365/185.18 |
| 2006/0028886 | A1* | 2/2006 | Choi et al. ............... 365/202 |
| 2006/0221712 | A1* | 10/2006 | Lowrey et al. .......... 365/189.01 |
| 2008/0316802 | A1* | 12/2008 | Happ et al. .............. 365/163 |

OTHER PUBLICATIONS

"OUM—A 180 nm Nonvolatile Memory Cell Element Technology For Stand Alone and Embedded Applications:", Stefan Lai and Tyler Lowrey, IEDM 2001, 4 pgs.
"Full Integration and Reliability Evaluation of Phase-change RAM Based on 0.24μm-CMOS Technologies", Y.N. Hwang, J.S. Hong, S.H. Lee, S.J. Ahn, G.T. Jeong, G.H. Koh, J.H. Oh, H.J. Kim, W.C. Jeong, S.Y. Lee, J.H. Park, K.C. Ryoo, H. Horii, Y.H. Ha, J.H. Yi, W.Y. Cho, Y.T. Kim, K.H. Lee, S.H. Joo, S.O. Park, U.I. Chung, H.S. Jeong and Kinam Kim, VLSI 2003, 2 pgs.
"Highly Manufacturable High Density Phase Change Memory of 64Mb and Beyond", S.J. Ahn, Y.J. Song, C.W. Jeong, J.M. Shin, Y. Fai, Y.N. Hwang, S.H. Lee, K.C. Ryoo, S.Y. Lee, J.H. Park, H. Horii, Y.H. Ha, J.H. Yi, B.J. Kuh, G.H. Koh, G.T. Jeong, H.S. Jeong, Kinam Kim and B.I. Ruy, IEDM 2004, 4 pgs.
"A 0.1μm 1.8V 256Mb 66MHz Synchronous Burst PRAM", Sangbeom Kang, Wooyeong Cho, Beak-Hyung Cho, Kwang-Jin Lee, Chang-See Lee, Hyung-Rock Oh, Buyng-Gil Choi, Qi Want, Hye-Jin Kim, Mu-Hui Park, Yu-Hwan Ro, Suyeon Kim, Du-Eung Kim, Kang-Sik Cho, Choong-Duk Ha, Oungran Kim, Ki-Sung Kim, Choong-Ryeol Hwang, Choong-Keun Kwak, Hyun-Geun Byun, and Yun Sueng Shin, ISSCC 2006/ Session 7, Non-Volatile Memory/7.5, 3 pgs.
"Enhanced Write Performance of a 64-Mb Phase-Change Random Access Memory", Hyung-Rok Oh, Beak-Hyung Cho, Woo Yeong Cho, Sangbeom Kang, Byung -Gil Choi, Hye-Jin Kim, Ki-Sung Kim, Du-Eung Kim, Choong-Keun Kwak, Hyun-Geun Byun, Gi-Tae Jeong, Hong-Sik Jeong and Kinam Kim, IEEE Journal of Solid-State Circuits, vol. 41, No. 1, Jan. 2006, 5 pgs.
"Processor-Based Built-in Self-Optimizer for 90nm Diode-Switch PRAM", Kyomin Sohn, Hyejung Kim, Jerald Yoo, Jeong-Ho Woo, Seung-Jin Lee, Woo-Yeong Cho, Bo-Tak Lim, Byung-Gil Choi, Chang-Sik Kim, Choong-Keun Kwak, Chang-Hyan Kim and Hoi-Jun Yoo, 2007 Symposium on VLSI Circuits Digest of Technical Papers, 2 pgs.

* cited by examiner

*Primary Examiner* — Hoai V Ho
*Assistant Examiner* — Jason Lappas
(74) *Attorney, Agent, or Firm* — Eschweiler & Associates, LLC (57) ABSTRACT

A method of addressing a memory cell includes applying a plurality of pulses to the memory cell, wherein a subsequent pulse has an amplitude greater than an initial pulse. In addition, a memory includes a memory cell and a control circuit configured to address the memory cell by applying a plurality of pulses to the memory cell, wherein a subsequent pulse has an amplitude greater than an initial pulse.

14 Claims, 6 Drawing Sheets

PROGRAM METHOD WITH LOCALLY OPTIMIZED WRITE PARAMETERS

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) and RAM devices (Random Access Memory or read-write memory) such as DRAMs and SRAMs.

In the case of SRAMs (Static Random Access Memory), individual memory cells typically comprise, for example, six transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs) exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory is called resistive or resistively switching memory devices. In such a resistive memory, a memory material positioned between two appropriate electrodes (i.e., an anode and a cathode) is placed, by appropriate switching processes, in a more or less conductive state, wherein the more conductive state corresponds, for example, to a logic "1", and the less conductive state corresponds, for example, to a logic "0" (or vice versa). Suitable resistive memories can be, for example, perovskite memory, as described in W. W. Zhuang et al., "Novel Colossal Magnetoresistive Thin Film Nonvolatile Resistance Random Access Memory (RRAM)", IEDM 2002, resistive switching in binary oxides (OxRAM), for example, as described in I. G. Baek et. al., "Multi-layer crosspoint binary oxide resistive memory (OxRAM) for post-NAND storage application", IEDM 2005, phase change memory (PCRAM), and conductive bridging RAM (CBRAM), as described in M. Kund et al., "Conductive bridging RAM (CBRAM): An emerging non-volatile memory technology scalable to sub 20 nm", IEDM, 2005.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current is applied to the electrodes, wherein the current heats the phase change material beyond the crystallization temperature thereof. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Figure 1:
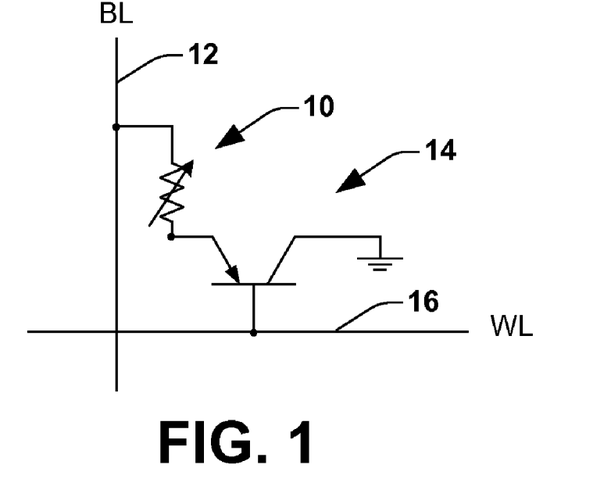
FIG. 1 is a schematic diagram illustrating a conventional memory architecture employing a select transistor for selective access to a memory element associated therewith.

Conventionally, resistively switched memories such as phase change memory devices are organized in one or more arrays of phase change cells in a core area of the device, wherein each phase change memory cell is composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment of the invention, a method of programming a memory cell is provided. The method comprises establishing a program condition based on a memory cell performance characteristic, and using the program condition to program the memory cell.

In another embodiment of the invention, a memory comprises an array of memory cells. The method also comprises a programming optimization circuit configured to perform an optimization process on a sampling of memory cells associated with a subset of the array, and further configured to output optimization result data associated therewith. The memory further comprises a control circuit configured to evaluate the optimization result data and establish a program condition for memory cells associated with the subset of the array.

The method and memory system of the present invention is applicable to both binary state memory cells and multi-state memory cells.

The following description and annexed drawings set forth in detail certain illustrative aspects and implementations of the invention. These are indicative of only a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout. The invention relates to a method and related memory circuit that prevents an overreset condition during an addressing of a memory cell.

Figure 2:
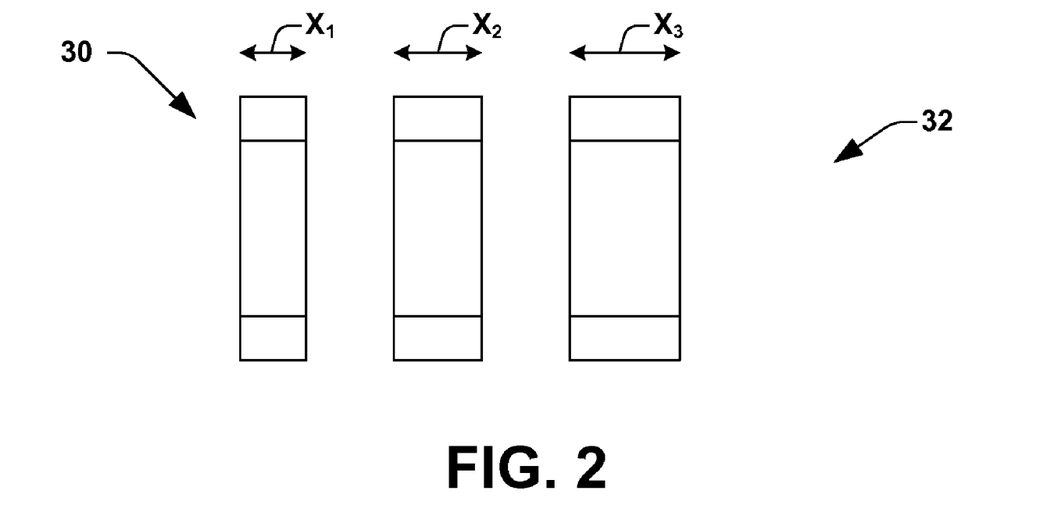
FIG. 2 is a plurality of phase change memory elements having different critical dimensions associated with variations in a manufacturing process.

As highlighted above, a phase change memory cell is switched between different states by performing a SET operation and a RESET operation, respectively. As illustrated in FIG. 2, when manufacturing a memory element such as a phase change memory element, the manufacturing process has a certain amount of variability, wherein a critical dimension (or CD) associated with a memory element 30 may vary between an acceptable minimum and maximum value. In FIG. 2, while $X_2$ may be the nominal critical dimension, variations in the manufacturing process may cause the critical dimension to vary between $X_1$ and $X_3$. In the above example, both $X_1$ and $X_3$ may still fall within an acceptable range, and thus be within specification for purposes of passing various functional and parametric testing. When the critical dimension is at the low end (e.g., $X_1$), the current density associated with the RESET current pulse is substantially greater than would normally be present for a nominal or larger critical dimension, and the increased current density may cause additional heating of the thermal environment of the memory cell. Similarly, when the critical dimension is at the high end (e.g., $X_3$), the current density associated with a SET or RESET pulse is substantially less than would normally be present for a nominal or smaller critical dimension, and the decreased current density may cause less than expected heating of the thermal environment of the cell. Consequently, based on variations in memory cells that may be due to process variations, one predetermined set of write parameters may not be optimal in addressing various cells within a single array or various cells on different chips that may differ from one another due to, for example, process variations.

The present invention, according to one embodiment, is directed to a system and method of write parameter optimization and subsequent use of such optimized write parameters in a memory device. In the above manner write parameters are employed that are more tailored for a memory cell's specific needs based on variations that may exist between various memory cells, for example, due to process variations.

Figure 3:
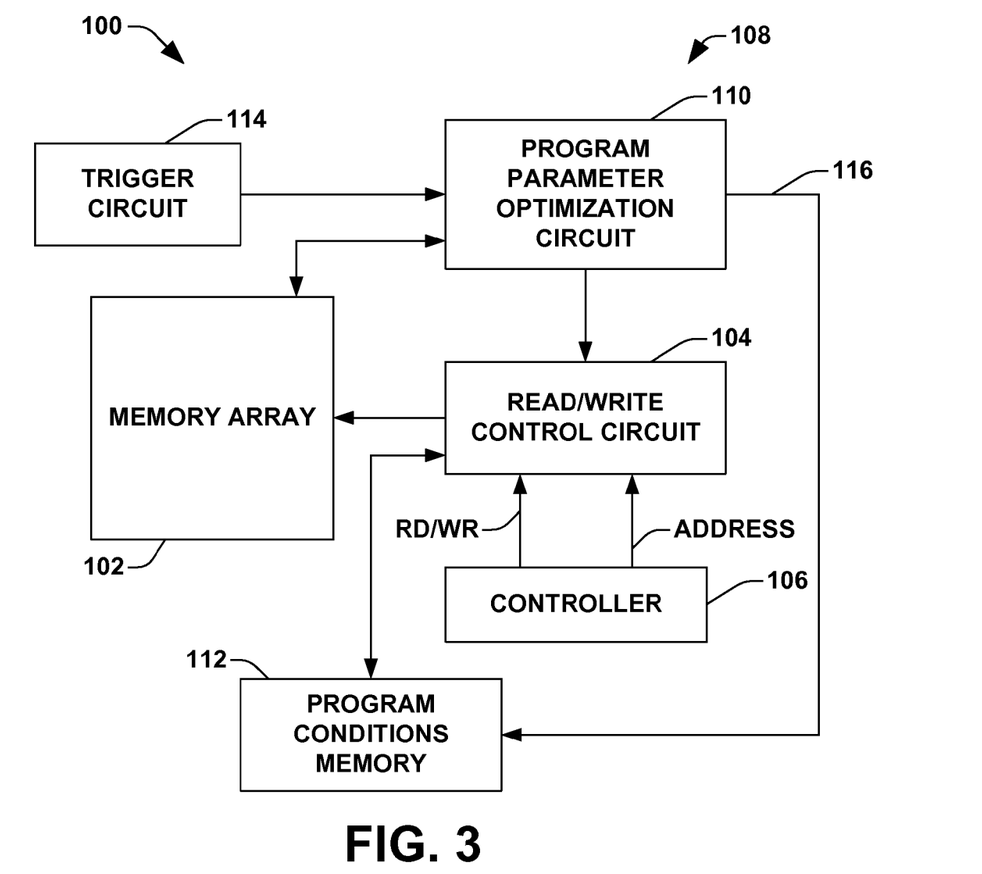
FIG. 3 is a block diagram illustrating a memory operable to generate and employ optimized write parameters according to one embodiment of the invention.

Turning to FIG. 3, a memory system 100 is provided that includes a memory array 102. In one embodiment of the invention, the memory array comprises an M×N array of memory cells such as phase change memory cells. While the various embodiments described herein are described in conjunction with phase change memory cells, it should be understood that the invention is not so limited, but instead can be applicable to any type memory, and all such alternatives are contemplated as falling within the scope of the present invention.

The memory array 102 is accessed via a read/write control circuit 104 that is operable to perform a read or write operation on the array 102 based on a read/write control signal (RD/WR) provided thereto by a controller 106. In addition, the location within the array 102 that is accessed by the read/write control circuit 104 for either a read or write is dictated by an address signal (ADDRESS) provided by the controller 106.

According to one embodiment of the invention, a write parameter optimization system 108 includes a program parameter optimization circuit 110, a program conditions memory 112, and a trigger circuit 114. Upon a trigger signal received by the trigger circuit 114, the program parameter optimization circuit 110 initiates a program parameter optimization process in which subsets of the memory array 102 are characterized separately to ascertain an optimized set of write parameters that ensure reliable operation of each subset of memory cells. The optimized set of write parameters 116 are then stored in the program conditions memory 112. In one embodiment, the program parameter optimization circuit 110 performs the optimization process for all subsets of the memory array 102, and saves unique optimized write parameters 116 for each array subset to the program conditions memory 112. In one embodiment an array subset corresponds to an array sector, or even the entire array, and in another embodiment a subset corresponds to a page of memory. Any memory cell grouping may comprise a subset, and all such alternatives are contemplated as falling within the scope of the present invention.

After optimization has occurred and all optimized write parameters 116 are stored in the program conditions memory 112, upon a write instruction (WR) being received at the read/write control circuit 104 from the controller 106, the unique set of write parameters associated with the provided address is retrieved from the program conditions memory 112. The read/write control circuit 104 then uses the retrieved optimized write parameters of the array subset associated with the specified address to write data to the memory array 102. In the above manner, data is written to the specified address using write parameters that ensure a reliable write operation by accommodating any variations those cells may have compared to other cell subsets. Alternatively, instead of waiting for a write instruction to retrieve write parameters, the optimized write parameters may be preloaded by the read/write control circuit 104, and such variation is contemplated as falling within the scope the invention.

In accordance with one embodiment of the invention, the trigger circuit 114 is configured to generate a trigger signal to repeat the optimization process after an optimization associated with system initialization. In one embodiment the trigger circuit 114 may generate a trigger signal upon detection of a predetermined thermal condition, such as when the temperature exceeds a temperature threshold or falls below a temperature threshold. In such case, the system 100 operates to re-optimize write parameters that may ensure reliable programming across a range of temperatures for memory cells that may vary between one another due to process variations, for example. In another alternative embodiment, the trigger circuit 114 is configured to generate a trigger signal based upon a count in the number of write cycles or some other timing metric that may correlate with a change in performance of cells in the array 102. While in the above embodiments the trigger signal is generated by a trigger circuit 114 local to the memory array, in another embodiment the trigger signal may be generated by an external source, and all such variations are contemplated as falling within the scope of the invention.

Therefore according to the invention a trigger event in which the trigger circuit 114 generates a trigger signal corresponds to some predetermined monitored event that occurs after an initialization optimization so that new optimized write parameters may be identified as conditions are detected that will likely lead to a change in programming performance.

The manner in which the program parameter optimization process is executed can be performed in a variety of ways, and all such variations are contemplated as falling within the scope of the present invention. In one embodiment, one or more program (write) conditions are varied on a sampling of memory cells within a subset of the memory array, and for each of the cells programmed with a given write condition, a read operation is performed to evaluate the reliability of the write. In one embodiment, each of the cells can be read with varying sense amplifier latching or switching thresholds to evaluate a resistance distribution reflecting the written data, including for example, a minimum resistance, a maximum resistance, a median resistance, etc. In one embodiment, the sampling of cells may be predetermined for each subset of the memory array. In an alternative embodiment the sampling of cells comprises selecting a predetermined number within the subset of the memory in a random fashion using a random number generator or other similar circuit or component.

Figure 4:
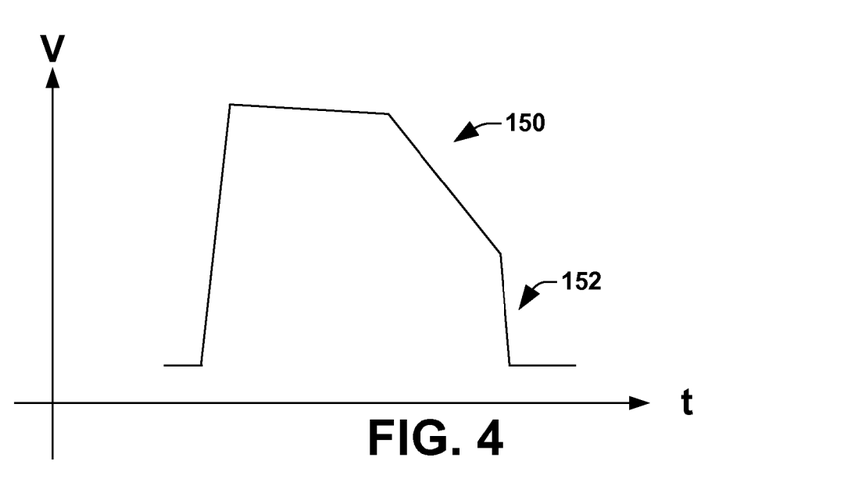
FIG. 4 is a graph showing various aspect features of a SET pulse for a phase change type memory device according to an embodiment of the invention.

In one embodiment of the invention a target resistance value is established for a given subset of memory cells within the array 102, and program conditions are then modified based on the target resistance value. In one embodiment of the invention (for phase change memory cells) program conditions (write parameters) that can be modified comprise, for example, I_RESET (a current magnitude of the RESET pulse), I_SET (a current magnitude of the SET pulse), t_RESET (a time duration of the RESET pulse), and t_SET (a time duration of the SET pulse). In addition, as illustrated in FIG. 4, other program conditions may include, but are not limited to, the trailing slope time 150 of the SET pulse, and the sloped pulse termination time 152. In addition, other write parameters may be modified in addition to, or instead of, the conditions highlighted above, and all such variations are contemplated as falling within the scope of the invention.

In another alternative embodiment, optimization of a program condition may comprise changing the sense amplifier reference latching level during the read of the subset of cells based upon the evaluation of the reliability performance of the subset of cells. In this context the sense amplifier level is considered a program condition in that it impacts the reliability of write operations by ensuring an accurate read of the data written thereto. Further, while the examples provided herein modify one write parameter at a time for ease of understanding and simplicity of explanation, it should be understood that multiple write parameters may be modified in a concurrent fashion, and such variations are contemplated as falling within the scope of the present invention.

Figure 5:
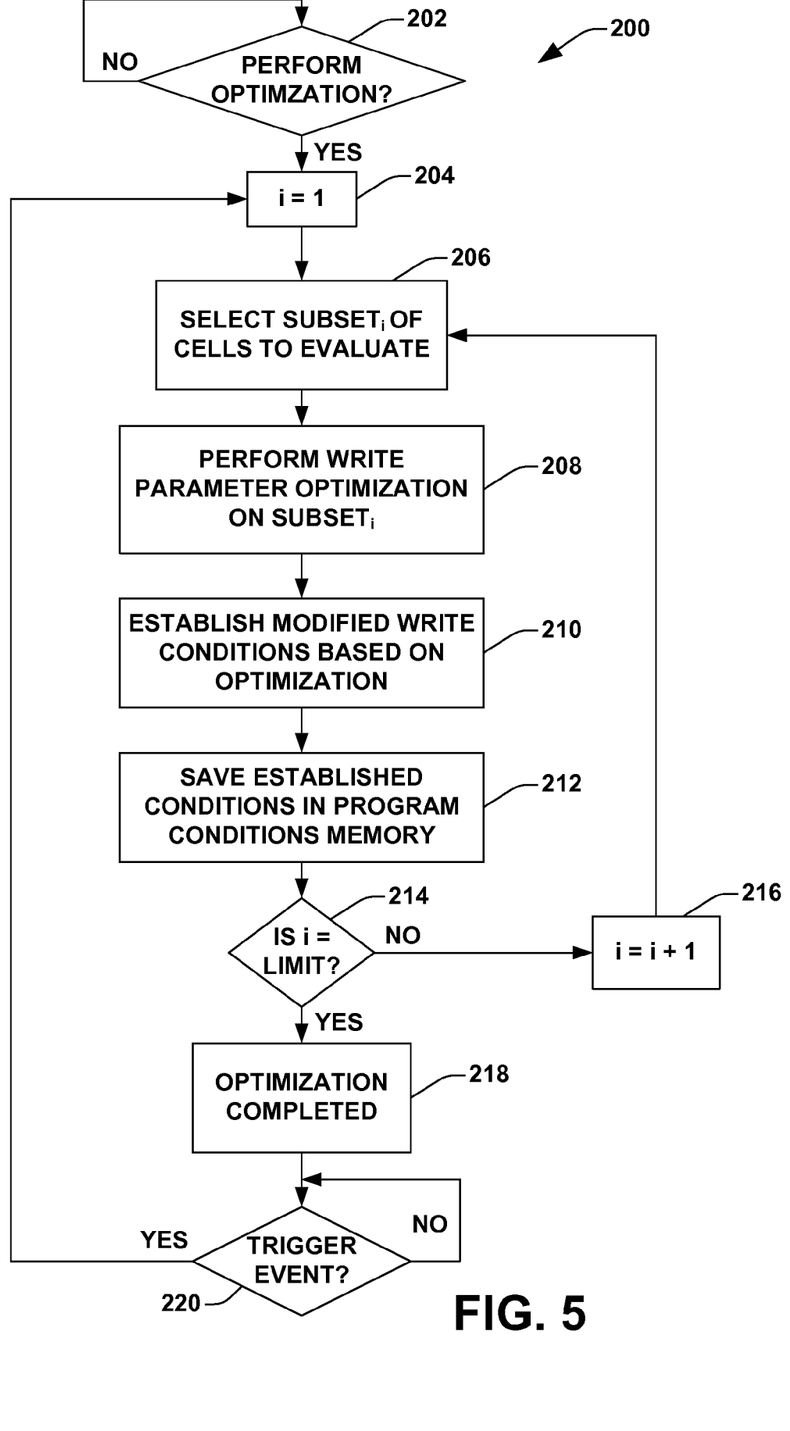
FIG. 5 is a flow chart illustrating a method of generating optimized write parameters for use in a memory device according to one embodiment of the invention.

Turning to FIG. 5, a method 200 of performing a write parameter optimization is provided according to one embodiment of the invention. While the method 200 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At 202 a query is made whether an optimization process is to be performed. In one embodiment, an affirmative answer (YES at 202) is the equivalent to receipt of a trigger signal based on some predetermined metric. Upon receipt of a trigger indication at 202 a variable "i" representing a subset of memory cells to be optimized is initialized at 204. In one embodiment of the invention, the memory array is divided into a plurality of memory cell subsets (e.g., sectors or pages), and a sample number of cells in each subset is then evaluated to characterize the program behavior of the cells associated with that subset. At 206 the subset associated with the variable "i" is selected, and a write parameter optimization operation is then performed on subset$_i$ at 208. Further details of the write parameter optimization process will be described infra, for example, in conjunction with FIGS. 6A and 6B.

The modified write parameters that are based upon the optimization process are then established at 210 and these established write parameters or conditions are then saved in a program conditions memory at 212. Subsequently, at 214 a query is made as to whether the variable "i" is equal to a predetermined threshold or limit value. In one embodiment the limit value represents a value that is indicative of all subsets in the memory array being evaluated. Alternatively, however, the limit value may differ in cases where only a fraction of the subsets are evaluated, thereby leaving the non-optimized subsets to have default write parameters (e.g., associated with nominal cells) associated therewith.

If the variable "i" is equal to the limit value (YES at 214), the optimization of the memory array is complete at 218, and the system then waits until another trigger event is detected (YES at 220), at which point the optimization process 200 is re-initiated at 204. As highlighted supra, a trigger event may correspond to a detected thermal condition, a count of a number of write cycles, a predetermined time period, and/or some other characteristic associated with a performance of the memory cells within the array.

If the variable "i" has not reached a predetermined threshold or limit value (NO at 214), the variable is incremented at 216, and the method 200 selects the next memory cell subset for evaluation at 206. In one embodiment, the increment value at 216 is selected so that all subsets are evaluated. Alternatively, however, a different increment value may be selected, and non-selected subsets can be given write parameters that match a neighboring subset or comprise interpolated values associated with neighboring subsets, and all such variations are contemplated as falling within the scope of the present invention.

Figure 6A:
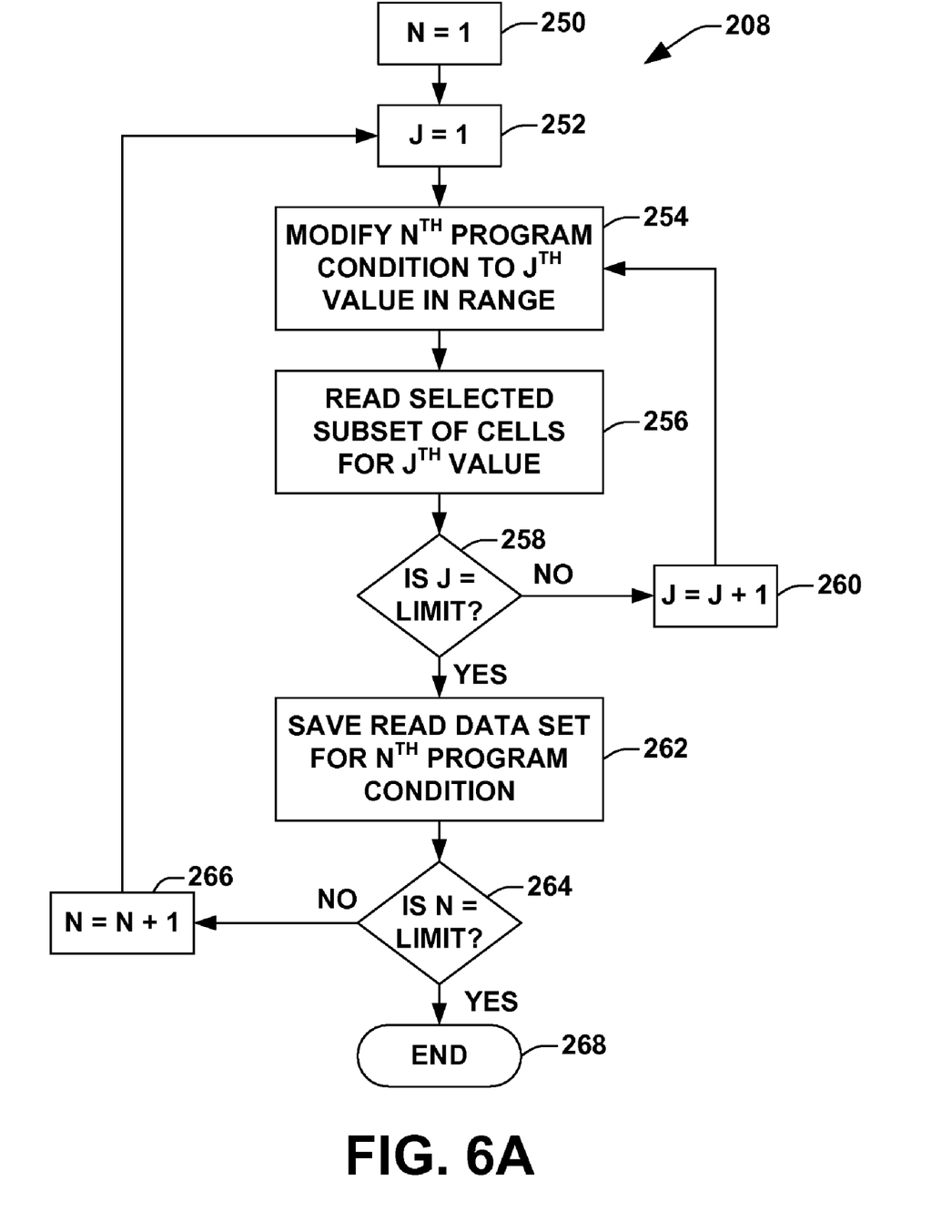
FIG. 6A is a flow chart illustrating a method of performing a write parameter optimization process according to one embodiment of the invention.

The write parameter optimization process 208 may be accomplished in a variety of different ways, and all such alternatives are contemplated by the present invention. One embodiment is illustrated in FIG. 6A, wherein two variables "N" and "J" are initialized at 250 and 252, respectively. In this embodiment, the variable "N" represents the program condition to be evaluated, and "J" represents the value of the parameter within its range. For example, if there are two program conditions to be evaluated such as I_RESET and t_RESET, N=1 may indicate that I_RESET is being evaluated. Further, if I_RESET is being evaluated for five different current pulse magnitude values $I_1, I_2, I_3, I_4$ and $I_5$, J=1 may indicate that the evaluation is being conducted with an I_RESET value of $I_1$.

At 254, the $N^{th}$ program condition is modified to the $J^{th}$ value in the predetermined range, and the sampling of cells in subset$_i$ are programmed in accordance therewith. The sampling of cells is then read at 256 to ascertain the programming reliability associated with that particular program condition. In one embodiment, a given write parameter condition is evaluated by subsequently reading it with varying sense amplifier threshold levels to ascertain how close the cell is to having an unreliable program condition. Alternatively, the default sense amplifier threshold level may be used and solely a functional analysis can be performed over the range of program conditions to see if the subset of cells will operate reliably across the entire range, or at what point in the range the cells appear to behave unreliably. Based on the resultant data read operation (as well as further data), a write parameter condition for that particular write parameter will be subsequently identified according to some predetermined performance criteria, and such identified parameter may become at least one of an optimized set of write parameters for the given subset.

At 258, a query is made whether "J" is equal to its limit value. If not (NO at 258), J is incremented so that the next value in the range for the given program condition N is employed in writing to the subset of cells, and acts 254 and 256 are repeated. If at 258, all the values in the range have been employed (YES at 258), the read data set for all the read operations for J=1 to J=limit are saved at 262 for evaluation thereof to establish the optimized write parameter(s).

At 264 a query is made whether all the desired program conditions have been tested by checking whether N is equal to some predetermined limit value. If not (NO at 264), the program condition variable N is incremented and the optimization process 208 repeats at 252 and the next program condition is varied across some predetermined range, and subsequently read for each variation, with the data collected at 262. If N has reached the limit value (YES at 264) then all the program conditions have been evaluated for that given subsets, and the process 208 ends at 268 to return to FIG. 5 at 210, in one embodiment.

Figure 6B:
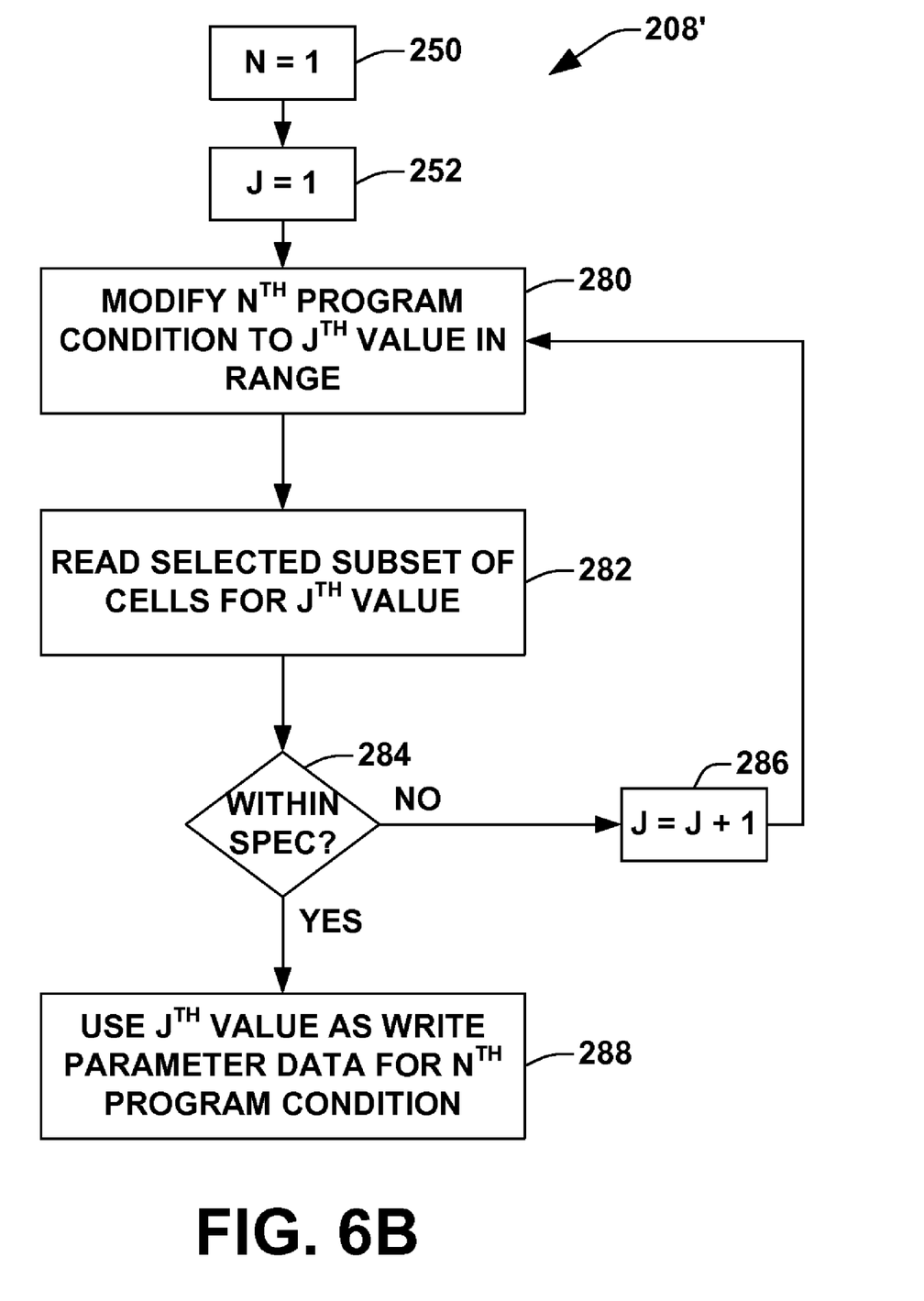
FIG. 6B is a flow chart illustrating a method of performing a write parameter optimization process according to another embodiment of the invention.

Performing the write parameter optimization process 208' according to an alternative embodiment of the invention is provided in FIG. 6B. Similar to FIG. 6A, the embodiment of FIG. 6B initializes program condition variable N and range variable J at 250 and 252, respectively. Next, the $N^{th}$ program condition is set to the $J^{th}$ value in the range at 280, wherein J=1 in this embodiment represents the most aggressive level for that given program condition. For example, for program condition I_RESET, the level that is most aggressive may be the largest current value $I_5$ in the range. The sampling of cells in the selected subset$_i$ are then read at 282 and evaluated to determine whether the selected cells are within a predetermined specification (e.g., meets the specification with an additional predetermined guard band margin).

If the sampling of cells within subset$_i$ do not meet the predetermined specification (e.g., some predetermined resistance distribution associated with the phase change material) (NO at 284), then J is incremented at 286 to go to the next program level for that particular program condition N, wherein the next level moves incrementally toward the "safest" program level for that given program condition. The process 208' then repeats at 280, 282 and 284. If the program level J does result in the sampling of cells in subset$_i$ meeting the predetermined specification (YES at 284), then that particular level J for that program condition N is identified as information for use at 288 in subsequently establishing the optimized write parameters for that subset of cells in the memory array.

In one embodiment, one advantage of the optimization process 208' of FIG. 6B is that it attempts to identify quickly the information that may be most helpful in generating the optimized write parameters, as opposed to testing the sampling of cells through the entire range of J.

Figure 7:
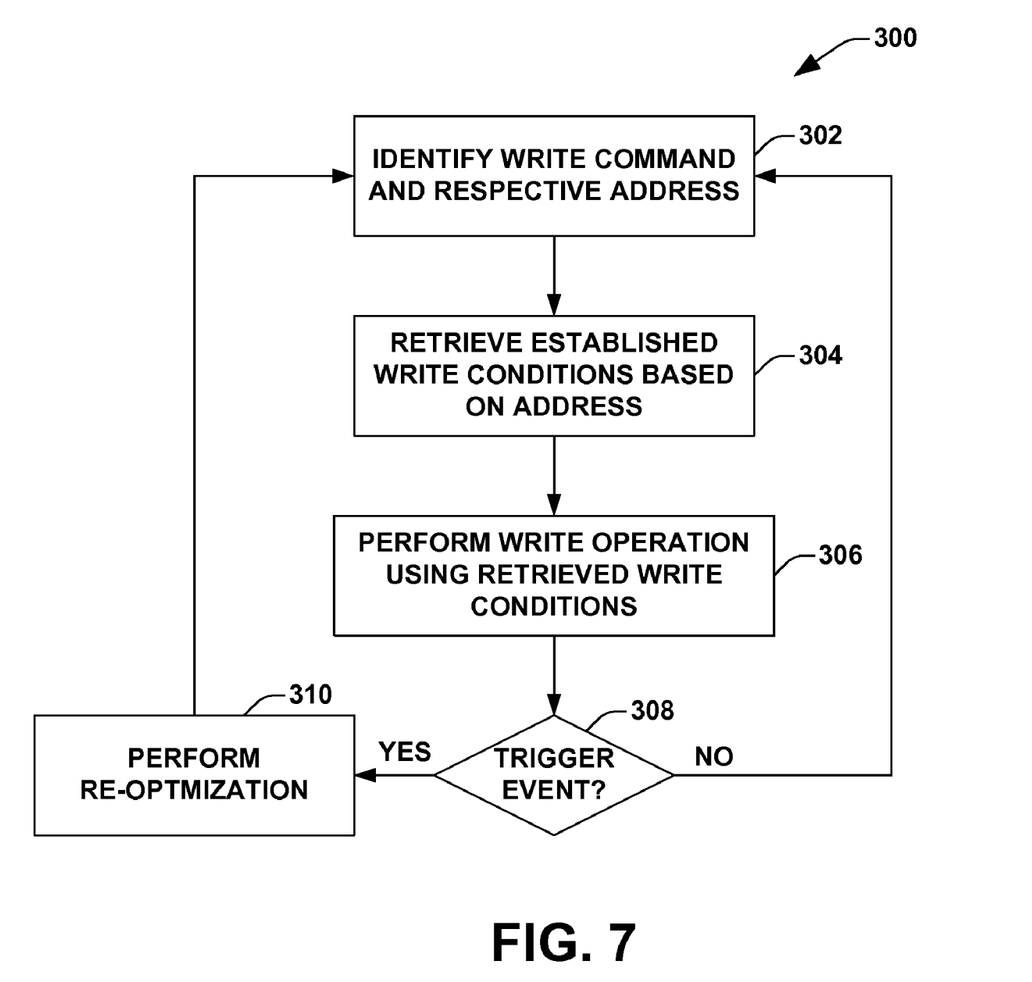
FIG. 7 is a flow chart illustrating a method of using optimized write parameters in a programming operation of a memory device according to one embodiment of the invention.

Referring now to FIG. 7, a method 300 of using optimized write parameters is disclosed according to another embodiment of the invention. At 302 a write command and the address to which the write operation is to be performed is received. Based on the received address, a potentially unique set of optimized write parameters are retrieved for use in performing the write operation at 304. In one embodiment, the parameters are retrieved from a program conditions memory local to the array. As has been discussed supra, since each array subset may vary from one another due to, for example, process variations, the write parameters may differ for different write operations to different addresses in the same memory array.

The retrieved write parameters are then utilized in performing the write operation at 306. At 308 a query is made as to whether a trigger event has occurred. If so (YES at 308), a re-optimization process is performed at 310 to re-evaluate whether the present optimized write parameters need to be changed. After such re-optimization at 310, the method 300 returns to 302 to identify the next write command and respective address. If no trigger even occurs (NO at 308), the method 300 returns back to 302.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory, comprising:
   an array of memory cells;
   a programming optimization circuit configured to perform an optimization process by reading a sampling of programmed memory cells associated with a subset of the array, and output optimization result data associated therewith; and
   a control circuit configured to evaluate the optimization result data and establish a program condition for memory cells associated with the subset of the array,
   wherein the memory cells comprise multi-level phase change memory cells.

2. A memory, comprising:

an array of memory cells;

a programming optimization circuit configured to perform an optimization process on a sampling of memory cells associated with a subset of the array, and output optimization result data associated therewith;

a control circuit configured to evaluate the optimization result data and establish a program condition for memory cells associated with the subset of the array; and a program condition memory configured to store the established program conditions from the control circuit for a plurality of different subsets of the array.

3. The memory of claim 2, wherein the control circuit is configured to receive a program control signal and an address, retrieve one or more program conditions from the program condition memory based on the address, and employ the retrieved one or more program conditions to program a memory cell in the array associated with the address.

4. The memory of claim 1, further comprising a trigger circuit configured to generate a trigger signal for initiating the optimization process of the programming optimization circuit.

5. The memory of claim 4, wherein the trigger circuit is configured to generate the trigger signal based on one of a programming cycle count and a detected thermal condition associated with the array.

6. The memory of claim 1, wherein the array of memory cells comprises an array of phase change memory cells.

7. The memory of claim 1, wherein the subset of the array comprises one of a sector or a page of the memory array.

8. A system containing a memory, comprising:

an array of memory cells comprising at least a portion of the memory;

a programming optimization circuit configured to perform an optimization process by reading a sampling of programmed memory cells associated with a subset of the array, and output optimization result data associated therewith; and a control circuit configured to evaluate the optimization result data and establish a program condition for memory cells associated with the subset of the array; and a program condition memory configured to store the established program conditions from the control circuit for a plurality of different subsets of the array.

9. The memory of claim 8, wherein the control circuit is configured to receive a program control signal and an address, retrieve one or more program conditions from the program condition memory based on the address, and employ the retrieved one or more program conditions to program a memory cell in the array associated with the address.

10. The memory of claim 8, further comprising a trigger circuit configured to generate a trigger signal for initiating the optimization process of the programming optimization circuit.

11. The memory of claim 10, wherein the trigger circuit is configured to generate the trigger signal based on one of a programming cycle count and a detected thermal condition associated with the array.

12. The memory of claim 8, wherein the array of memory cells comprises an array of binary state or multi-level phase change memory cells.

13. A method of programming a memory cell, comprising:

establishing a program condition based on a measured memory cell performance characteristic of a sampling of memory cells in a portion of a memory array; and using the program condition to program a memory cell residing in the memory array portion, wherein the measured memory cell performance characteristic comprises a read data state of the sampling of memory cells, and wherein the read data state comprises a read data state over a plurality of varied write conditions.

14. The method of claim 13, wherein the read data state comprises an identification of a resistance distribution of the sampling of memory cells.

* * * * *